United States Patent
Mujica et al.

(10) Patent No.: US 8,670,501 B2
(45) Date of Patent: Mar. 11, 2014

(54) DIGITAL PRE-DISTORTION OF NON-LINEAR SYSTEMS WITH REDUCED BANDWIDTH FEEDBACK

(75) Inventors: Fernando A. Mujica, Allen, TX (US); Lei Ding, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 425 days.

(21) Appl. No.: 12/962,369

(22) Filed: Dec. 7, 2010

(65) Prior Publication Data

US 2011/0135034 A1    Jun. 9, 2011

Related U.S. Application Data

(60) Provisional application No. 61/267,911, filed on Dec. 9, 2009.

(51) Int. Cl.
  *H04K 1/02*     (2006.01)
  *H04L 25/03*    (2006.01)
  *H04L 25/49*    (2006.01)

(52) U.S. Cl.
  USPC ........... 375/296; 375/295; 327/291; 332/106; 341/20; 341/173

(58) Field of Classification Search
  None
  See application file for complete search history.

(56) References Cited

U.S. PATENT DOCUMENTS

| | | | |
|---|---|---|---|
| 6,549,067 B1 * | 4/2003 | Kenington | 330/52 |
| 6,591,090 B1 * | 7/2003 | Vuorio et al. | 455/126 |
| 7,349,490 B2 | 3/2008 | Hunton | |
| 7,729,446 B2 | 6/2010 | Copeland | |
| 7,773,692 B2 | 8/2010 | Copeland | |
| 2001/0007435 A1 * | 7/2001 | Ode et al. | 330/149 |
| 2004/0017859 A1 * | 1/2004 | Sills et al. | 375/296 |
| 2005/0123066 A1 * | 6/2005 | Sarca | 375/296 |
| 2005/0242876 A1 | 11/2005 | Obernosterer | |
| 2006/0067425 A1 * | 3/2006 | Windisch | 375/296 |
| 2007/0241812 A1 | 10/2007 | Yang et al. | |
| 2010/0159856 A1 | 6/2010 | Kato et al. | |
| 2012/0128099 A1 * | 5/2012 | Morris et al. | 375/297 |

OTHER PUBLICATIONS

PCT/ISA/220, PCT/US2010/059712 Internation filing date Dec. 9, 2010, Date of mailing Aug. 29, 2011.

* cited by examiner

*Primary Examiner* — Shuwang Liu
*Assistant Examiner* — Gina McKie
(74) *Attorney, Agent, or Firm* — Steven A. Shaw; Wade James Brady, III; Frederick J. Telecky, Jr.

(57) ABSTRACT

Embodiments of the invention provide a DPD system where the transmit reference signal is transformed, including sub-sampling, frequency translation, and the like, to match the feedback signal, which goes thru a similar transformation process, to obtain an error signal. The same transformation is applied to a system model, which may be Jacobian, Hessian, Gradient, or the like, in an adaptation algorithm to minimize error.

19 Claims, 5 Drawing Sheets

DIGITAL PRE-DISTORTION OF NON-LINEAR SYSTEMS WITH REDUCED BANDWIDTH FEEDBACK

CROSS-REFERENCE TO RELATED APPLICATIONS

This application claims the benefit of the filing date of U.S. Provisional Patent Application No. 61/267,911, which is titled "Method and Apparatus for Digital Pre-Distortion of Non-Linear Systems with Reduced Bandwidth Feedback" and was filed Dec. 9, 2009, the disclosure of which is hereby incorporated by reference herein in its entirety.

TECHNICAL FIELD

Embodiments of the invention are directed, in general, to electronic systems and, more specifically, to pre-distortion of non-linear systems using limited bandwidth feedback.

BACKGROUND

Pre-distortion is used in transmission systems to compensate for the linear and nonlinear effects of the transmission channel upon the signals to be transmitted. An adaptation engine may generate an error correction signal for a pre-distortion circuit. The error correction signal causes the pre-distortion circuit to modify the input signal in a way that counteracts the transmission channel response. As a result, the system output signal should be equivalent to the input signal with some gain value applied without other modification. The adaptation engine must know the transmission channel response in order to generate the correct error correction signal.

An adaptation engine internal to the system can be used to measure a transmission channel response. The adaptation engine receives both the system input signal and the system output signal and then compares the input and output signals to determine the transmission channel response. As a result, the adaptation engine can determine the transmission channel response for current operating conditions. However, in such systems, the system output signal is provided to the adaptation engine via a feedback channel. The feedback channel introduces its own response to the output signal in addition to the transmission channel response. Accordingly, the adaptation engine generates an error correction signal designed to counteract both the transmission channel response and a feedback channel response.

SUMMARY OF THE INVENTION

Embodiments of the invention provide a system and method for generating digital pre-distortion (DPD) coefficients using a lower sampling rate in the feedback loop than the rate used in the transmission signal.

In one embodiment, comprises a digital pre-distortion circuit in a transmission path between a system input and a transmission circuit. The transmission circuit may be a power amplifier, for example. A feedback circuit is coupled between the output of the transmission circuit and a training module. The system feedback circuit may include an analog-to-digital converter, for example. The feedback circuit provides feedback signal samples from the output of the transmission circuit at a feedback sampling rate that is lower than an input sampling rate used for signals at the system input. A training circuit is coupled to the system input and coupled to an output of the feedback circuit. The training circuit also includes a feedback-model circuit that modifies the system input signals to match characteristics of the feedback signal samples. The feedback-model circuit may modify one or more characteristics of the system input signal, such as a sampling rate, a signal delay, a signal phase, an image signal, a linear frequency response distortion, and a non-linear signal path distortion.

The training circuit further comprises an error calculation circuit that is coupled to both the feedback-model circuit and the feedback circuit. The error calculation circuit generates a feedback error signal based upon the feedback signal samples and the modified system input signals. The training circuit further comprises a measurement matrix module that includes models of the digital pre-distortion circuit, the transmission circuit, and the feedback-model circuit. The measurement matrix module generates a current system model signal based upon the current operating conditions of the system. A digital pre-distortion adaptation circuit in the training circuit is coupled to the outputs of the error calculation circuit and the measurement matrix module. The digital pre-distortion adaptation circuit generates updated pre-distortion coefficients for the digital pre-distortion circuit based upon the feedback error signal and the current system model signal.

BRIEF DESCRIPTION OF THE DRAWINGS

Figure 1:
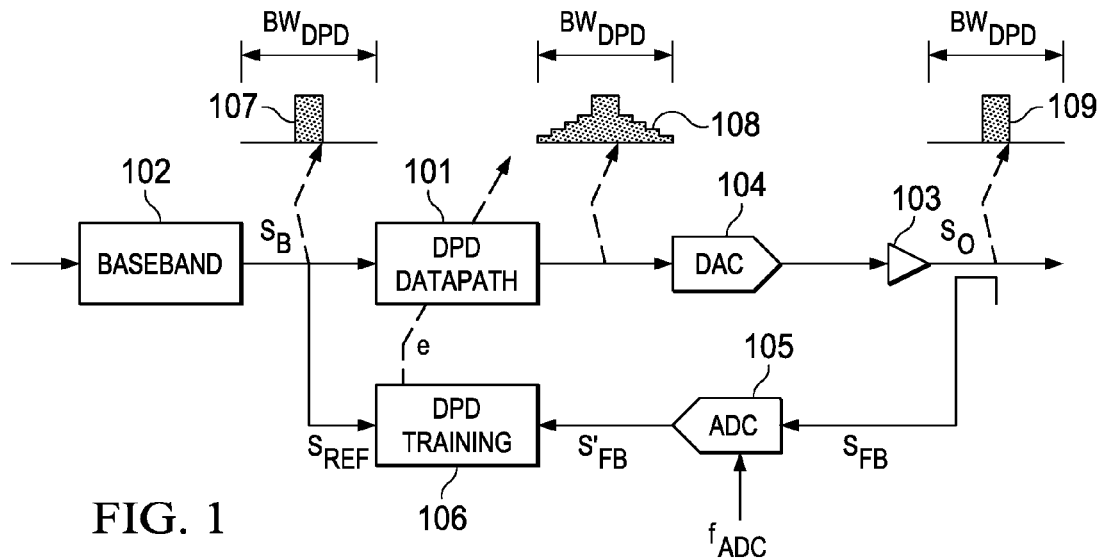
Figure 2:
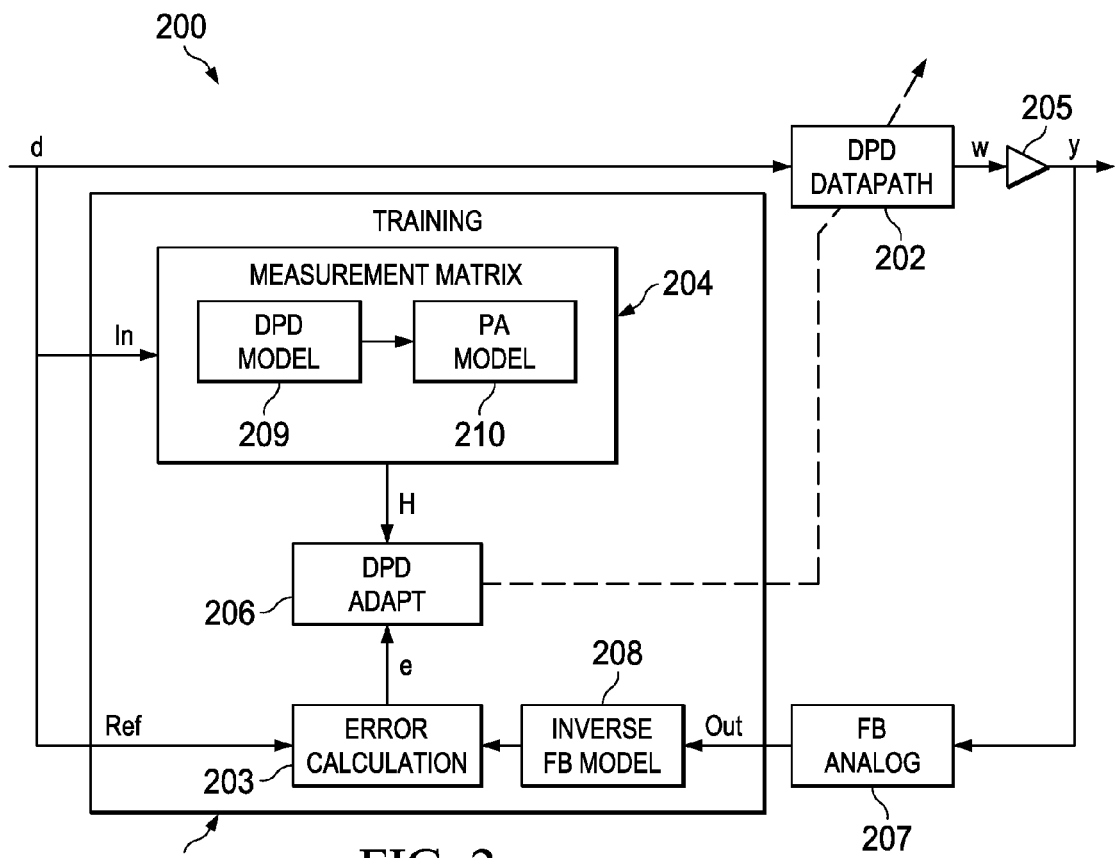
Figure 3:
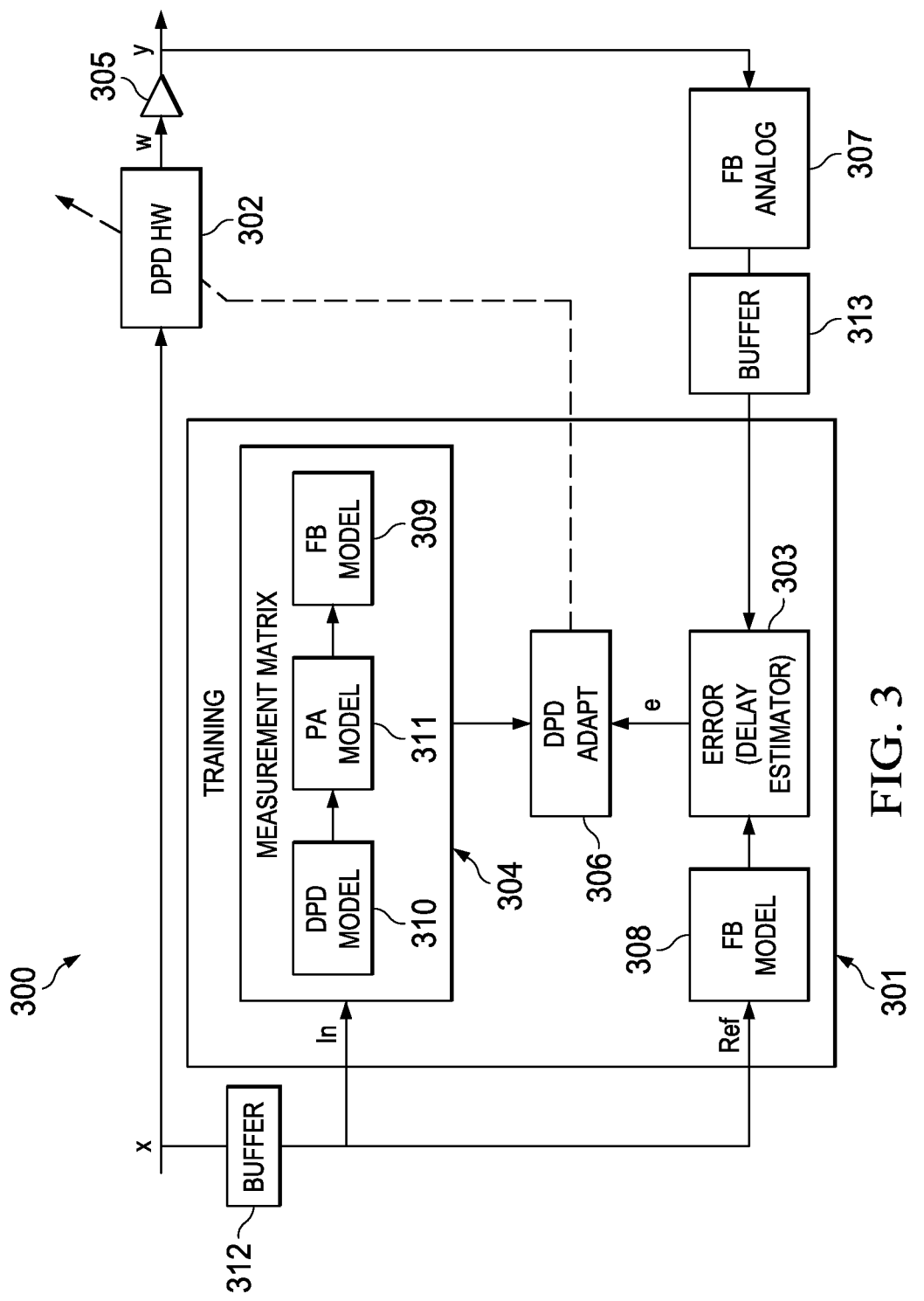
Figure 4:
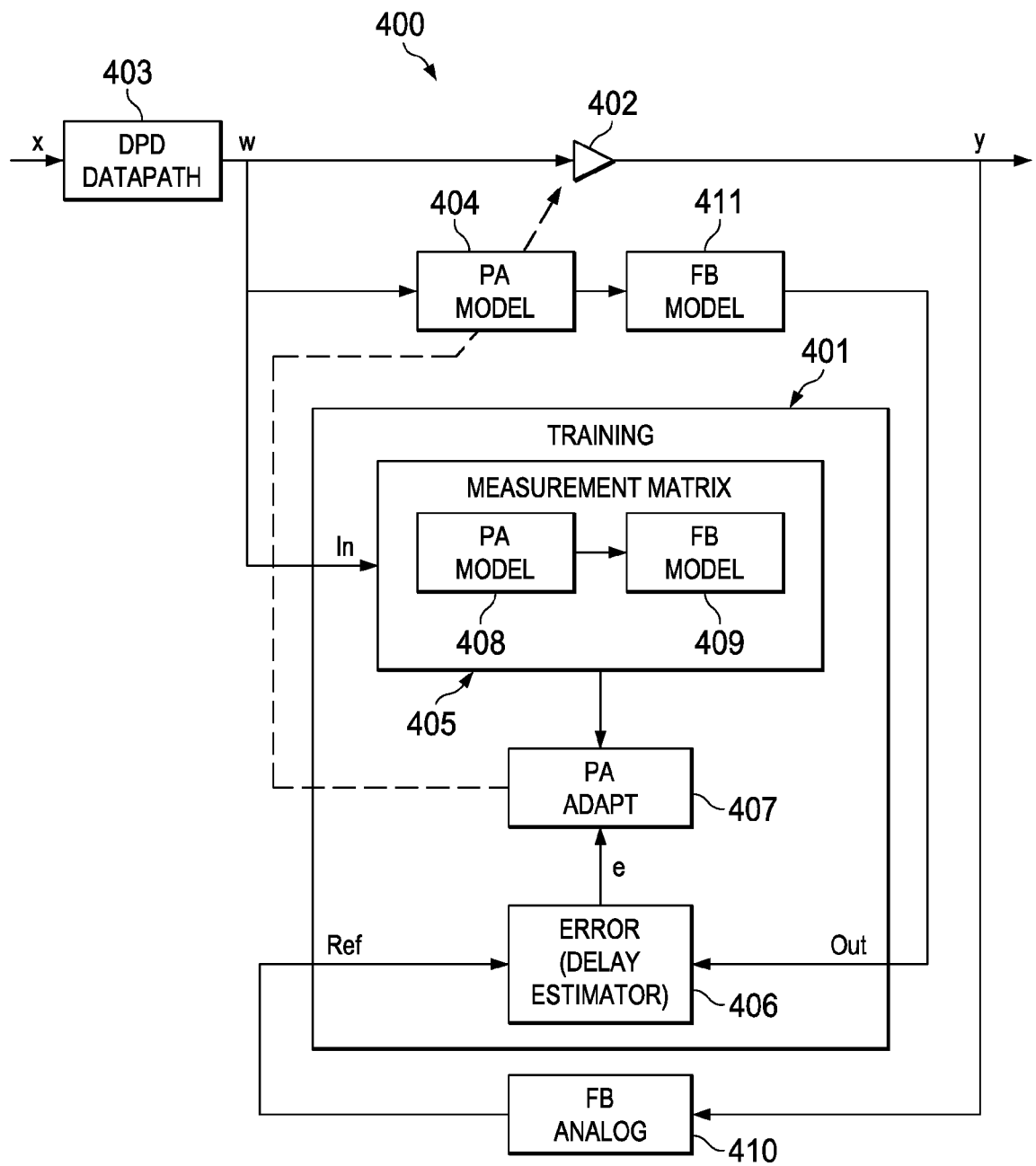
Figure 5:
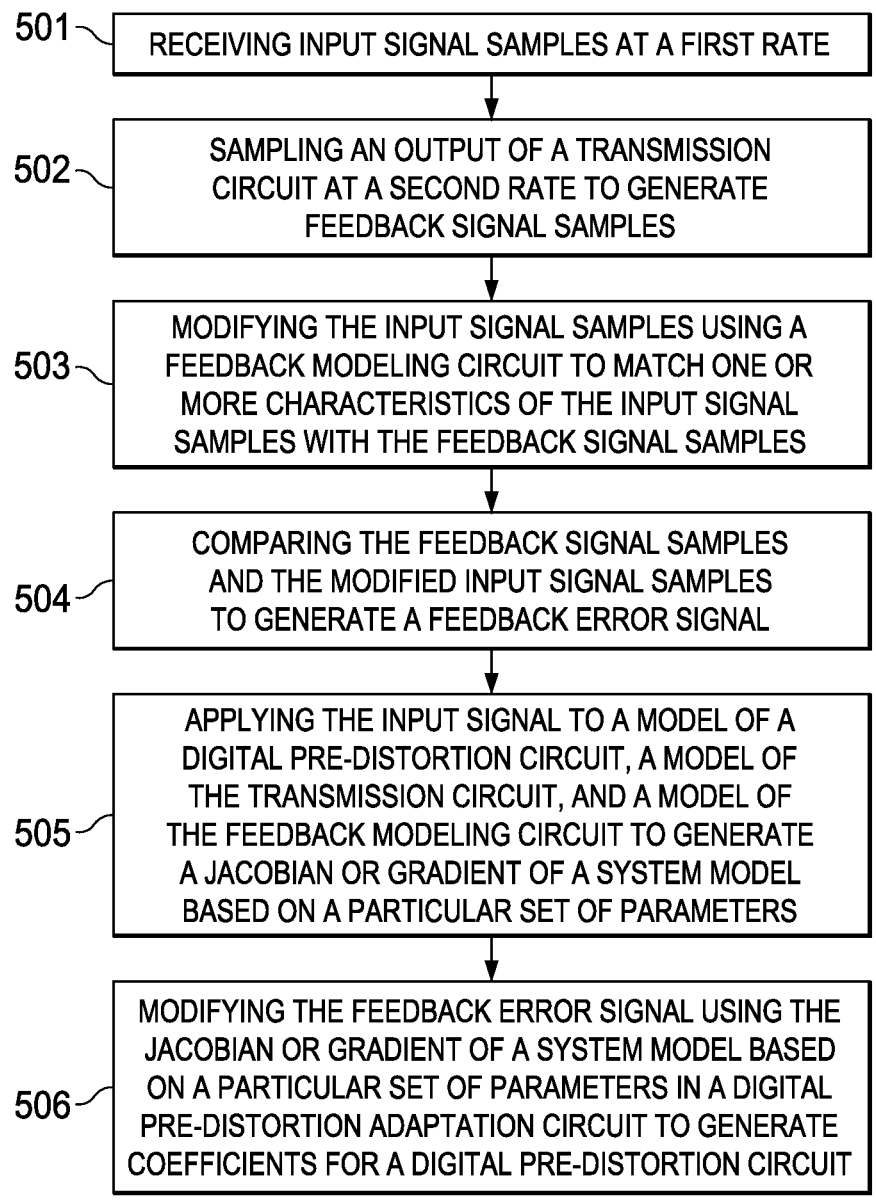
Figure 6:
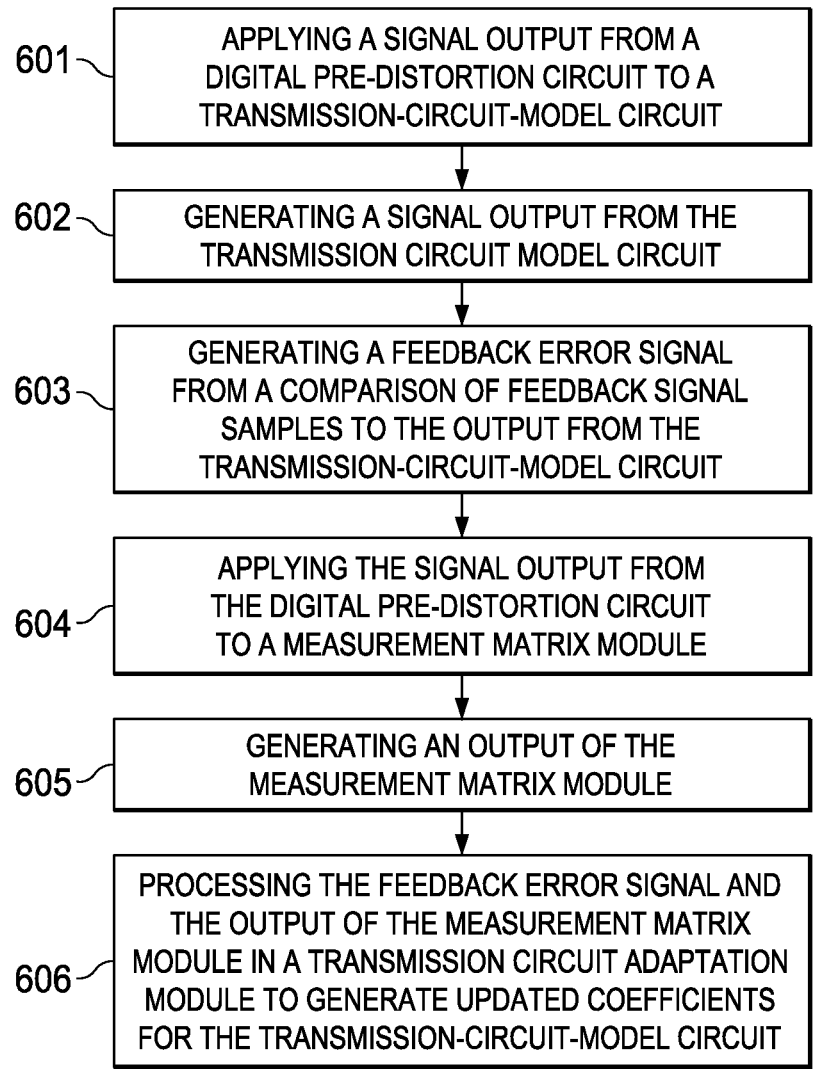

Having thus described the invention in general terms, reference will now be made to the accompanying drawings, wherein:

FIG. 1 illustrates a simplified pre-distortion system;

FIG. 2 is a block diagram of a pre-distortion system with direct learning architecture;

FIG. 3 is a block diagram illustrating a sub-sampled DPD adaptation system;

FIG. 4 illustrates a sub-sampled DPD adaptation system that is used to estimate PA model parameters;

FIG. 5 is a flowchart illustrating a method for providing digital pre-distortion coefficients according to one embodiment; and FIG. 6 is a flowchart illustrating a method for providing transmission circuit model coefficients according to one embodiment.

DETAILED DESCRIPTION

The invention now will be described more fully hereinafter with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art. One skilled in the art may be able to use the various embodiments of the invention.

Embodiments of the invention provide methods for Digital Pre-Distortion (DPD) operation using reduced-bandwidth feedback data. In general, the term "sub-sampling DPD adaptation" as used herein refers to the case where the data rate of the feedback signal is lower than the data rate of the reference or transmitted signal. Use of a sub-sampled DPD adaptation provides certain advantages, such as reducing feedback complexity because a lower Analog-to-Digital Converter (ADC) sampling rate required in the feedback loop, and enabling access to markets with converter-data-rate limits due to export control restrictions.

The proposed sub-sampled DPD solution has the following additional features and benefits. The reference signal from the transmit path is transformed to match the feedback signal from the transmit path. The reference signal goes thru a transformation process, such as sub-sampling or frequency translation, which is similar to the transformation of the feedback signal. The reference signal and feedback signal are used to obtain an error signal. The same transformation process that is used for the reference and feedback signals is also applied to the system model in the adaptation algorithm to minimize the error. The system model may be Jacobian, Hessian or Gradients, for example. The system can accommodate arbitrary feedback signal transformations as long as there is no information loss. An alias-preserving sub-sampling operation is an example of a suitable transformation, however, arbitrary frequency shifts, frequency shaping are also valid transformations. One scenario of interest is during direct conversion architecture in the transmit path and intermediate frequency on the feedback path. Transformation processing is applied to the clean reference signals instead of noisy feedback signals, which may relax the processing requirements in certain scenarios.

FIG. 1 illustrates a simplified pre-distortion system. DPD datapath 101 pre-distorts the transmission signals $S_B$ received from the baseband circuit 102 so that the signal $S_O$ output from Power Amplifier (PA) 103 resembles the desired baseband signal $S_B$ after being distorted by Digital-to-Analog Converter (DAC) 104 and PA 103. The output signal $S_o$ is used as feedback signal $S_{FB}$, which is digitized ($S'_{FB}$) in ADC 105 and provided to DPD Training circuit 106. The baseband reference signal $S_B$ is also provided as a reference signal $S_{REF}$ to DPD Training circuit 106, which compares the digitized feedback signal $S_{FB}$ to the reference signal $S_{REF}$ and generates error signal e that is used to set parameters in DPD datapath 101.

FIG. 1 is a simplified schematic and is not intended to include all components expected to be found in a real-world system. For example, an up-converter circuit or mixer would typically be located between DAC 104 and PA 103, and a down-converter circuit or mixer would typically be located in the feedback loop prior to the ADC 105. These circuits are used to convert the signals between baseband and an RF transmission frequency. It will be understood that PA 103 in FIG. 1 and the other power amplifier (PA) components shown in FIG. 2-4 are merely representative of any system or component that adds distortion to a transmission path. PA 103 and the other PA elements cited in other examples may be any linear or non-linear component, group of components, or system. DPD datapath 202 and the other DPD datapath and hardware examples herein may be used to counter distortion added any such component, group of components, or system.

The goal of DPD datapath 101 is to modify the baseband signal $S_B$ in such a way that the subsequent modifications caused by DAC 104 and PA 103 result in a linear output signal $S_O$ that meets spectral mask requirements set forth by standards bodies. The DPD datapath 101 is typically non-linear path and, therefore, causes the bandwidth of the baseband signal $S_B$ to expand. The bandwidth of the datapath is designated as $BW_{DPD}$ in FIG. 1. In one embodiment, the bandwidth of baseband signal $S_B$ is 20 MHz (107), for example, and DPD datapath 101 causes the signal bandwidth to expand by a factor of five to 100 MHz (108). Further distortion by DAC 104 and PA 103 modify the signal $S_O$ back to the original 20 MHz bandwidth (109). Accordingly, in FIG. 1 $BW_{DPD}$ should be 100 MHz.

A full rate feedback system requires all of the signal information in the feedback loop. This requires that ADC 105 in the feedback loop have approximately twice the bandwidth of the datapath (i.e. $2 \cdot BW_{DPD}$ or 200 MHz). A sub-sampled DPD system satisfies the relationship: $f_{ADC} < 2 \cdot BW_{DPD}$. However, in a sub-sampled DPD system, the feedback analog bandwidth should be at least as large as $BW_{DPD}$.

FIG. 2 is a block diagram of a pre-distortion system 200 with direct learning architecture. Training module 201 compares the reference transmission signal d and the feedback output signal y and minimizes the error between these signals by adapting the parameters of DPD datapath 202. A training module in a direct learning system has three main components. Error Calculation module 203, in the simplest case, is a subtraction node between the reference signal and the system output. Error calculation module 203 also performs temporal and amplitude alignment of the reference signal and the feedback signal. Measurement Matrix module 204 provides a linear approximation of DPD datapath 202 and PA 205 for a given input around a specific DPD datapath parameter set. DPD Adapt module 206 uses the measurement matrix output H to update the DPD datapath parameters in a direction that minimizes the error. The adaptation in DPD Adapt module 206 may be based on a simple Least Mean Square (LMS) algorithm or a sophisticated Kalman-based approach that also tracks the covariance matrix of the parameter space.

The direct learning architecture of FIG. 2 will operate in situations where the feedback signal is not spectrally aligned with the reference signal. For example, the system may use direct conversion RF architecture for the transmitter 205, while the feedback loop uses intermediate frequency architecture 207. It will be understood that other system may also use the direct learning architecture and that the examples used herein are for illustrative purposes only and are not intended to limit the invention. Adaptation is still possible in this case as long as a transformation exists, such as a baseband equivalent model, that can invert the effect of the feedback transformation (e.g., frequency shift and complex to real transformation in the case of intermediate frequency architecture). The Inverse Feedback module 208 in system 200 corrects any distortions or effects caused by Feedback Analog module 207. The purpose of Inverse Feedback module 208 is to provide Error Calculation module 203 with a true representation of the output y of the transmission path.

Measurement Matrix module 204 comprises a DPD Model 209 and a PA Model 210. DPD Model 209 represents the behavior of DPD datapath 202, and PA Model 210 represents the behavior of PA 205. DPD Model 209 and PA Model 210 may be matrices that provide an error gradient for all DPD and PA parameters, respectively. Measurement Matrix 204 uses DPD Model 209 and PA Model 210 to evaluate what effect an error correction will have on DPD 202 and PA 205. Measurement Matrix output H is used by DPD Adapt 206 to modify or optimize the effects of error correction signal e on DPD datapath 202 and PA 205 under the current operating conditions.

System 200 represents a full rate DPD application in which the output of Feedback (FB) Analog module 207 is a full rate signal. In a sub-sampled DPD, the ADC rate in the feedback path is lower than the sampling rate in the transmission path. As a result, in a sub-sampled DPD application, the signal output from FB Analog 207 would be distorted due to the lower sampling rate.

The following system model represents the digital pre-distortion systems.

Process equation:

$$x_{i+1} = F_i x_i + u_i \qquad \text{Eq. 1}$$

Measurement equation:

$$y_i = T(x_i, d_i) + v_i \qquad \text{Eq. 2}$$

where:
i corresponds to the variable at time I;
x: parameter vector;
y: observation;
d: known input;
u: process noise;
v: measurement noise;
F: parameter transition matrix;
T(x, d): non-linear measurement model parameterized by x and with input d.

An approximation of Equation 2 is obtained through linearization as follows:

$$y_i \approx T(x_o, d_i) + H_i(d_i)(x_i - x_o) + v_i \qquad \text{Eq. 3}$$

where H is the Measurement Matrix or Jacobian of T and defined as $$H_i(d) = \left. \frac{\partial T(x, d)}{\partial x} \right|_{x=x_i} \qquad \text{Eq. 4}$$

Using the following definition:

$$\bar{y}_i = y_i - T(x_o, d_i) + H_i(d_i)x_o \qquad \text{Eq. 5}$$

Equation 3 can be written as:

$$\bar{y} \approx H_i(d_i)x_i + v_i \qquad \text{Eq. 6}$$

H may be a Jacobian or Gradient of the function T. The Gradient of T is illustrated in Equation 7.

$$\nabla T = \begin{pmatrix} \frac{\partial T}{\partial x_1} \\ \frac{\partial T}{\partial x_2} \\ \vdots \\ \frac{\partial T}{\partial x_n} \end{pmatrix} \qquad \text{Eq. 7}$$

Jacobian is defined in Equation 8. It is the derivative of multiple functions with respect to a set of parameters.

$$JT = \begin{pmatrix} \frac{\partial T_1}{\partial x_1} & \frac{\partial T_1}{\partial x_2} & \cdots & \frac{\partial T_1}{\partial x_n} \\ \frac{\partial T_1}{\partial x_1} & \frac{\partial T_2}{\partial x_2} & & \frac{\partial T_2}{\partial x_n} \\ \vdots & & \ddots & \vdots \\ \frac{\partial T_m}{\partial x_1} & \frac{\partial T_m}{\partial x_2} & \cdots & \frac{\partial T_m}{\partial x_n} \end{pmatrix} \qquad \text{Eq. 8}$$

Going back to Equations 1-6, if input d is a scalar, then Equation 4 returns a column vector. The column vector is the same size as parameter vector x and defined as gradient. If input d is a vector, Equation 4 returns a matrix, which can be viewed as a Jacobian (each sample corresponds to a different T) or a measurement of gradient for different samples (single T, but different measurements).

FIG. 3 is a block diagram illustrating a sub-sampled DPD adaptation system 300. Similar to the full rate adaptation system 200, system 300 includes a Training Module 301 that compares the reference transmission signal d and the feedback output signal y and minimizes the error between these signals by adapting the parameters of DPD hardware or datapath 302. Training module 301 includes Error Calculation module 303, Measurement Matrix module 304, and DPD Adapt module 306, which uses the measurement matrix output to update DPD hardware 302 to compensate for distortion added to the transmission path by PA 305.

Sub-sampling adaptation system 300 further includes FB Analog module 307, which samples the feedback signal at a lower rate than what is used in the transmission path. For example, in one embodiment, the sampling rate of the baseband digital input signal x may be 307.2 MHz, and FB Analog 307 may provide only one-half of the sampling rate. In such a system, FB Analog 307 may comprise real mixer sampled by an ADC operating at 307.2 MHz. Alternatively, FB Analog 307 may comprise two separate ADCs, one for the I channel and one for the Q channel, and each ADC operating at 153.6 MHz, or half the sampling rate of the baseband. Due to this sub-sampling of the feedback signal, the inputs to the Error Calculation module 303 are mismatched. The feedback signal is at 153.6 MHz and the reference input signal Ref is at 307.2 MHz.

To compensate for the sampling rate difference, sub-sampled DPD system 300 uses a model of the feedback transformation including sub-sampling (FB Model) instead of using an inverse of the feedback transformation as is typically done in systems such as pre-distortion system 200 (FIG. 2). The feedback model is applied to the clean reference signal Ref at FB Model module 308 to align the input reference signal to the feedback signal, which will allow Error Calculation module 303 to produce a meaningful error signal. The adaptation algorithm is made aware of this transformation to the input reference signal by adding FB Model module 310 to Measurement Matrix module 304. This will cause the Measurement Matrix module 304 to be transformed by the same feedback model that is modifying the input reference signal. Embodiments of the sub-sampled DPD adaptation use the chain of DPD Model 310, PA Model 311 and FB Model 309 to generate the Jacobian.

This approach described herein is agnostic of the adaptation algorithm and the method actually used to estimate the measurement matrix. The only requirement to implement the sub-sampled pre-distortion disclosed herein is to incorporate the FB Model modules 308/309 for the feedback transformation. DPD hardware 302 runs continuously to pre-distort the transmission signal using a set of parameters. Periodically, Training Module 301 will provide updated coefficients or parameters to DPD hardware 302 based upon error signals detected by comparing the reference signal and the feedback loop. The Feedback Model 309, 310 is estimated to ensure that the input reference signal is modified with the same effect as introduced by the FB Analog module 307.

The FB Model may adjust one or more parameters to introduce the same effect to the reference signal as FB Analog module 307 introduces to the feedback signal. The FB Model may change the sampling rate so that the rate of the input reference signal matches the feedback sampling rate. The FB Model may compensate for delay differences by adjusting a delay between samples in the reference signal and the feedback signal. The FB Model may adjust a phase of the reference signal. Depending upon whether the FB Analog is using real or complex ADC sampling, the FB Model may add an image to the reference signal. The FB Model may modify the reference signal to compensate for the linear frequency response of the feedback path. The FB Model may also compensate for non-linear feedback path distortion. FB Model 308 and 309 may include the same or different parameters or coefficients. The FB models may be different to compensate for timing delays between the samples received at Measurement Matrix 304 and FB Model 308 or Error Calculation module 303, for example.

By including non-idealities in the feedback model, the feedback path requirements can be relaxed because they will no longer affect pre-distortion performance on the transmit path. This is because the pre-distortion algorithm sees the combined transmit and feedback transfer function and, therefore, it does not need to see the inverse feedback transfer function that normally appears on the transmit path.

By introducing the FB Model in the Training module, reduced bandwidth operation is possible with relatively small performance loss. Test measurements have shown that up to a critically sampled feedback, the performance loss is negligible. For example, error vector magnitude (EVM) and adjacent channel leakage ratio (ACLR) loss is within 0.5 dB. Further sub-sampling of the feedback up to ¼ Nyquist results in 2 dB loss for EVM and ACLR. However, beyond this point, performance may degrade. It is noted that the amount of data used for adaptation affects system performance. Therefore, no significant computational savings are expected by using reduced bandwidth feedback.

The digital pre-distorter and PA models (DPD Model and PA Model) may be memoryless nonlinear models or a non-linear model with memory. Typical nonlinear models may be represented by polynomial functions or lookup tables. In one embodiment, both DPD and PA models are nonlinear models with 3-tap memory.

Sub-sampled DPD adaptation system 300 may be embodied as hardware, such as an application specific integrated circuit (ASIC), or in a combination of hardware and software. In one embodiment, the data path including DPD hardware 302, PA 305, and FB Analog module 307 are hardware components of an ASIC that are adapted to carry a transmission signal. The transmitted signals may be sent continuously along the data path. DPD hardware 302 modifies or pre-distorts the transmission signals according to parameters received at intervals from Training Module 301.

Training module 301 and its component parts may be embodied as hardware or as a software application running on a microprocessor. Samples of input reference signal x may be captured in buffer 312, and samples of the sub-sampled feedback signal may be captured in buffer 313. During training intervals, Training Module 301 receives data from buffers 312, 313 and modifies the samples from buffer 312 using FB Model 308. The samples are then compared in Error Calculation module 303 to generate an error signal. The error signal is provided to DPD Adapt 306, which further modifies the error signal based upon the Jacobian from Measurement Matrix 304. Updated pre-distortion parameters are then sent from DPD Adapt 306 to DPD hardware 302.

Buffers 312, 313 may be used to capture samples at regular intervals, or they may be adapted to capture samples at peak signal points or when the signals are above a predetermined threshold. The samples captured by buffers 312 and 313 are only needed when Training Module 301 is updating the DPD coefficients. At other times, the buffers may overwrite existing data in the buffers or the buffers may not store data until it is needed.

FIG. 4 illustrates a sub-sampled DPD adaptation system 400 that is used to estimate PA model parameters. PA Training module 401 receives input reference signals and feedback signals from either side of PA 402. Pre-distorted signal w from DPD Datapath 403 is input to PA 402, which then generates output signal y. FB Analog circuit 410 samples the feedback signal from output signal y at a lower rate than what is used in the transmission path. The output of FB Analog 410 is a digital baseband signal that is provided to Error Calculation module 406 within PA Training module 401. Pre-distorted signal w is provided to both PA Model 404 and Measurement Matrix module 405. The output of PA Model 404 is provided to FB Model circuit 411, which aligns the signal from PA Model 404 to the feedback signal from FB Analog 410. FB Model circuit 411 may modify one or more characteristics of the signal from PA Model 404 to match the feedback channel input signal, such as modifying a sampling rate, a signal delay, a signal phase, an image signal, a linear frequency response distortion, and a non-linear signal path distortion.

Error Calculation module 406 in Training module 401 receives the output signal from FB Model 411 and from FB Analog 410 and generates an error signal. PA Adapt 407 receives the error signal from Error Calculation module 406 and a Jacobian from Measurement Matrix module 405. PA Adapt 407 generates an updated set of PA Model coefficients and sends them to PA Model 404. Measurement Matrix 405 includes a copy of the PA Model 408 and FB Model 409, which may include the same parameters as used in PA Model 404 and FB Model 411, respectively.

FIG. 5 is a flowchart illustrating a method for providing digital pre-distortion coefficients according to one embodiment. In step 501, input signal samples are received at a first rate. The input signal samples may be received from a baseband circuit, for example. In step 502, the output of a transmission circuit is sampled at a second rate to generate feedback signal samples. The transmission circuit may be a power amplifier, for example. In step 503, the input signal samples are modified using a feedback modeling circuit to match one or more characteristics of the input signal samples with the feedback signal samples. In step 504, the feedback signal samples and the modified input signal samples are compared to generate a feedback error signal.

In step 505, the input signal is applied to a model of a digital pre-distortion circuit, a model of the transmission circuit, and a model of the feedback modeling circuit to generate a generating a Jacobian or Gradient of a system model based upon a particular set of parameters. The models of the digital pre-distortion circuit, the transmission circuit, and the feedback modeling circuit may be Jacobian or Hessian matrices or Gradient models of the circuits. In step 506, the feedback error signal is modified using the generating a Jacobian or Gradient of a system model based upon a particular set of parameters in a digital pre-distortion adaptation circuit to generate coefficients for a digital pre-distortion circuit.

FIG. 6 is a flowchart illustrating a method for providing transmission circuit model coefficients according to one embodiment. In step 601, a signal output from a digital pre-distortion circuit is applied to a transmission-circuit-model circuit. The transmission-circuit-model circuit may be a model of a power amplifier in one embodiment. In step 602, a signal is output from the transmission circuit model circuit. In step 602, a feedback error signal is generated based upon a comparison of feedback signal samples to the output from the transmission-circuit-model circuit. In step 604, the signal output from the digital pre-distortion circuit to a measurement matrix module. In step 605, an output of the measurement matrix module is generated. In step 606, the feedback error signal and the output of the measurement matrix module are processed in a transmission circuit adaptation module to generate updated coefficients for the transmission-circuit-model circuit.

Many modifications and other embodiments of the invention will come to mind to one skilled in the art to which this invention pertains having the benefit of the teachings presented in the foregoing descriptions, and the associated drawings. Therefore, it is to be understood that the invention is not to be limited to the specific embodiments disclosed. Although specific terms are employed herein, they are used in a generic and descriptive sense only and not for purposes of limitation.

What is claimed is:

1. A system, comprising:
    a digital pre-distortion circuit in a transmission path between a system input and a transmission circuit;
    a feedback circuit coupled between an output of the transmission circuit and a training module, the feedback circuit providing feedback signal samples from the output of the transmission circuit at a feedback sampling rate that is lower than an input sampling rate used for system input signals; and
    a training circuit coupled to the system input and coupled to an output of the feedback circuit, the training circuit comprising a feedback-model circuit operating to modify the system input signals to match characteristics of the feedback signal samples, the training circuit providing operating parameters to the digital pre-distortion circuit, the training circuit further comprising:
    a measurement matrix module comprising models of the digital pre-distortion circuit, the transmission circuit, and the feedback-model circuit, the measurement matrix module coupled to the system input, the measurement matrix module generating a Jacobian or Gradient of a system model based upon a particular set of parameters.

2. The system of claim 1, wherein the transmission circuit comprises a power amplifier.

3. The system of claim 1, wherein the feedback circuit comprises an analog-to-digital converter.

4. The system of claim 1, wherein the training circuit further comprises:
    an error calculation circuit coupled to the feedback-model circuit and the feedback circuit, the error calculation circuit generating a feedback error signal based upon the feedback signal samples and the modified system input signals.

5. The system of claim 1, further comprising:
    a first capture buffer coupled to the system input, the first capture buffer storing input signal samples at the input sampling rate; and
    a second capture buffer coupled to the feedback circuit, the second capture buffer storing feedback signal samples at the feedback sampling rate.

6. The system of claim 1, wherein the feedback-model circuit modifies one or more characteristics of the system input signals, the characteristics selected from a group consisting of: a sampling rate, a signal delay, a signal phase, an image signal, a linear frequency response distortion, and a non-linear signal path distortion.

7. A system, comprising:
    a digital pre-distortion circuit in a transmission path between a system input and a transmission circuit;
    a feedback circuit coupled between an output of the transmission circuit and a training module, the feedback circuit providing feedback signal samples from the output of the transmission circuit at a feedback sampling rate that is lower than an input sampling rate used for system input signals; and
    a training circuit coupled to the system input and coupled to an output of the feedback circuit, the training circuit comprising a feedback-model circuit operating to modify the system input signals to match characteristics of the feedback signal samples, the training circuit providing operating parameters to the digital pre-distortion circuit, the training circuit further comprising:
    an error calculation circuit coupled to the feedback-model circuit and the feedback circuit, the error calculation circuit generating a feedback error signal based upon the feedback signal samples and the modified system input signals;
    a measurement matrix module comprising models of the digital pre-distortion circuit, the transmission circuit, and the feedback-model circuit, the measurement matrix module coupled to the system input, the measurement matrix module generating a Jacobian or Gradient of a system model based upon a particular set of parameters; and
    a digital pre-distortion adaptation circuit coupled to outputs of the error calculation circuit and the measurement matrix module, the digital pre-distortion adaptation circuit generating updated pre-distortion coefficients for the digital pre-distortion circuit based upon the feedback error signal and the current system model signal.

8. The system of claim 7, further comprising:
    a first capture buffer coupled to the system input, the first capture buffer storing input signal samples at the input sampling rate; and
    a second capture buffer coupled to the feedback circuit, the second capture buffer storing the feedback signal samples at the feedback sampling rate.

9. The system of claim 7, wherein the feedback-model circuit modifies one or more characteristics of the system input signals, the characteristics selected from a group consisting of: a sampling rate, a signal delay, a signal phase, an image signal, a linear frequency response distortion, and a non-linear signal path distortion.

10. A system for adapting a transmission circuit model, comprising:
    a transmission circuit having an input that receives a transmission input signal and an output that provides a transmission output signal;
    a transmission-circuit-modeling circuit having an input that receives the transmission input signal and an output that provides a modified transmission input signal; and
    a training module having an input for receiving a feedback signal from the output of the transmission circuit, the training module also having inputs for receiving the transmission input signal and the modified transmission input signal, the training module, generating parameters for the transmission-circuit-modeling circuit the training module further comprises comprising:
    a measurement matrix module comprising models of a digital pre-distortion circuit, and the transmission circuit, the measurement matrix module receiving the transmission input signal, the measurement matrix module generating a Jacobian or Gradient of a system model based upon a particular set of parameters.

11. The system of claim 10, wherein the transmission circuit is a power amplifier.

12. The system of claim 10, wherein the training module further comprises:
    an error calculation circuit receiving the feedback signal and the modified transmission input signal, the error calculation circuit generating a feedback error signal.

13. A system for adapting a transmission circuit model, comprising:
    a transmission circuit having an input that receives a transmission input signal and an output that provides a transmission output signal;

a transmission-circuit-modeling circuit having an input that receives the transmission input signal and an output that provides a modified transmission input signal; and a training module having an input for receiving a feedback signal from the output of the transmission circuit, the training module also having inputs for receiving the transmission input signal and the modified transmission input signal, the training module, generating parameters for the transmission-circuit-modeling circuit the training module further comprises comprising:

an error calculation circuit receiving the feedback signal and the modified transmission input signal, the error calculation circuit generating a feedback error signal;

a measurement matrix module comprising models of a digital pre-distortion circuit, and the transmission circuit, the measurement matrix module receiving the transmission input signal, the measurement matrix module generating a Jacobian or Gradient of a system model based upon a particular set of parameters; and a digital pre-distortion adaptation circuit coupled to outputs of the error calculation circuit and the measurement matrix module, the digital pre-distortion adaptation circuit generating updated coefficients for the transmission-circuit-modeling circuit based upon the feedback error signal and the Jacobian or Gradient of a system model based upon a particular set of parameters.

14. A method, comprising:
receiving input signal samples at a first rate;
sampling an output of a transmission circuit at a second rate to, generate feedback signal samples;
modifying the input signal samples using a feedback modeling circuit to match one or more characteristics of the input signal samples with the feedback signal samples;
generating coefficients for a non-linear model with memory based upon the modified input signal samples and the feedback signal samples;
comparing the feedback signal samples and the modified input signal samples to generate a feedback error signal;
applying the modified input signal samples to a model of the digital pre-distortion circuit, a model of the transmission circuit, and a model of the feedback modeling circuit to generate a current system model signal; and
modifying the feedback error signal using the current system model signal in a digital pre-distortion adaptation circuit to generate the coefficients for the non-linear model with memory.

15. The method of claim 14, wherein the transmission circuit comprises a power amplifier.

16. The method of claim 14, wherein the models of the digital pre-distortion circuit, the transmission circuit, and the feedback modeling circuit are Jacobian matrices of the circuits.

17. The method of claim 14, wherein the models of the digital pre-distortion circuit, the transmission circuit, and the feedback modeling circuit are Gradient models of the circuits.

18. A method, comprising:
receiving input signal samples at a first rate;
sampling an output of a transmission circuit at a second rate to generate feedback signal samples;
modifying the input signal samples using a feedback modeling circuit to match one or more characteristics of the input signal samples with the feedback signal samples;
generating coefficients for a non-linear model with memory based upon the modified input signal samples and the feedback signal samples applying a signal output from a digital pre-distortion circuit to a transmission-circuit-model circuit;
generating a signal output from the transmission circuit model circuit;
generating a feedback error signal from a comparison of the feedback signal samples to the output from the transmission-circuit-model circuit;
applying a signal output from the digital pre-distortion circuit to a measurement matrix module;
generating an output of the measurement matrix module; and
processing the feedback error signal and the output of the measurement matrix module in a transmission circuit adaptation module to generate coefficients for the transmission-circuit-model circuit.

19. The method of claim 18, wherein the measurement matrix module further comprises:
a digital-pre-distortion-circuit model and a transmission-circuit model.

* * * * *